(12) United States Patent
Huiskamp et al.

(10) Patent No.: US 10,748,847 B2
(45) Date of Patent: Aug. 18, 2020

(54) METALLISATION FOR SEMICONDUCTOR DEVICE

(71) Applicant: Nexperia B.V., Nijmegen (NL)

(72) Inventors: Paul Huiskamp, Wijchen (NL); Godfried Henricus Josephus Notermans, Hamburg (DE)

(73) Assignee: Nexperia B.V., Nijmegen (NL)

(*) Notice: Subject to any disclaimer, the term of this patent is extended or adjusted under 35 U.S.C. 154(b) by 0 days.

(21) Appl. No.: 14/849,469

(22) Filed: Sep. 9, 2015

(65) Prior Publication Data
US 2016/0104676 A1    Apr. 14, 2016

(30) Foreign Application Priority Data
Oct. 8, 2014 (EP) .................... 14188213

(51) Int. Cl.
*H01L 23/522* (2006.01)
*H01L 27/02* (2006.01)
(Continued)

(52) U.S. Cl.
CPC ........ *H01L 23/5226* (2013.01); *H01L 23/522* (2013.01); *H01L 24/05* (2013.01);
(Continued)

(58) Field of Classification Search
CPC ....... H01L 2924/00; H01L 2924/00014; H01L 2924/1305; H01L 2924/14; H01L 2924/1306; H01L 2924/12042; H01L 2924/13091; H01L 2924/12041; H01L 2924/13033; H01L 2924/13034; H01L 2924/13062; H01L 29/1095; H01L 29/7811; H01L 27/11; H01L 27/1108; H01L 27/12; H01L 27/1203; H01L 27/1277; H01L 27/1281; H01L 27/1296; H01L 27/142; H01L 27/14659;
(Continued)

(56) References Cited

U.S. PATENT DOCUMENTS 7,229,921 B2 * 6/2007 Hironaga .......... H01L 21/02068
                                                    257/E21.169
8,405,224 B2 * 3/2013 Itoh .................... H01L 23/3677
                                                    257/758

(Continued)

FOREIGN PATENT DOCUMENTS

JP    2007-258328 A    10/2007
JP    2008-047718 A    2/2008

OTHER PUBLICATIONS

Sze, S.M. "The Physics of Semiconductor Devices", Chapter 4—Thyristors, $2^{nd}$ edition, John Wiley & sons, New York, 13 pgs. (1981).
(Continued)

*Primary Examiner* — Mary A Wilczewski
(74) *Attorney, Agent, or Firm* — Ohlandt, Greeley, Ruggiero & Perle, L.L.P.

(57) ABSTRACT

The present disclosure relates to a semiconductor device comprising a metallisation stack. The metallisation stack may include a first metallisation layer and a second metallisation layer. The first metallisation layer may be electrically connected to the second metallisation layer by a two or more stacked inter-metal vias.

15 Claims, 5 Drawing Sheets

(51) Int. Cl.
   *H01L 23/00* (2006.01)
   *H01L 23/532* (2006.01)

(52) U.S. Cl.
   CPC ...... *H01L 27/0292* (2013.01); *H01L 23/5222* (2013.01); *H01L 23/53223* (2013.01); *H01L 23/53257* (2013.01); *H01L 2224/0401* (2013.01); *H01L 2224/05091* (2013.01); *H01L 2224/05096* (2013.01); *H01L 2224/13022* (2013.01); *H01L 2224/13147* (2013.01)

(58) Field of Classification Search
   CPC ....... H01L 27/15; H01L 27/301; H01L 27/32; H01L 27/10805; H01L 27/10873; H01L 23/522; H01L 23/5222; H01L 23/5226; H01L 23/53223; H01L 23/53257; H01L 24/05; H01L 27/0292; H01L 2224/0401; H01L 2224/05091; H01L 2224/05096; H01L 2224/13022; H01L 2224/13147
   USPC .......................................... 257/686, E23.167
   See application file for complete search history.

(56) References Cited

U.S. PATENT DOCUMENTS

| | | | | |
|---|---|---|---|---|
| 9,478,508 | B1* | 10/2016 | LaRoche | H01L 23/5226 |
| 9,601,545 | B1* | 3/2017 | Tu | H01L 27/0805 |
| 9,704,919 | B1* | 7/2017 | Lu | H01L 27/228 |
| 9,773,773 | B1* | 9/2017 | Lam | H01L 27/11807 |
| 9,893,278 | B1* | 2/2018 | Chuang | H01L 27/222 |
| 2002/0055249 | A1* | 5/2002 | Pio | H01L 21/768 |
| | | | | 438/622 |
| 2002/0111053 | A1* | 8/2002 | Umemura | H01L 23/5226 |
| | | | | 439/81 |
| 2003/0067079 | A1* | 4/2003 | Ishikawa | H01L 21/2855 |
| | | | | 257/774 |
| 2003/0148603 | A1* | 8/2003 | Gardner | H01L 21/76805 |
| | | | | 438/637 |
| 2004/0046266 | A1* | 3/2004 | Akamatsu | H01L 21/28518 |
| | | | | 257/784 |
| 2004/0101663 | A1* | 5/2004 | Agarwala | H01L 21/76829 |
| | | | | 428/209 |
| 2004/0130028 | A1* | 7/2004 | Nakamura | H01L 23/5226 |
| | | | | 257/758 |
| 2004/0152240 | A1* | 8/2004 | Dangelo | B82Y 10/00 |
| | | | | 438/122 |
| 2005/0194679 | A1* | 9/2005 | Tokumine | H01L 23/5222 |
| | | | | 257/734 |
| 2006/0017167 | A1 | 1/2006 | Iguchi et al. | |
| 2006/0275962 | A1* | 12/2006 | Lee | B82Y 10/00 |
| | | | | 438/152 |
| 2006/0276028 | A1* | 12/2006 | Park | H01L 21/76802 |
| | | | | 438/629 |
| 2007/0034960 | A1 | 2/2007 | Zhang et al. | |
| 2008/0029898 | A1* | 2/2008 | Farooq | H01L 23/5226 |
| | | | | 257/774 |
| 2008/0054474 | A1* | 3/2008 | Park | H01L 21/76802 |
| | | | | 257/762 |
| 2008/0111226 | A1* | 5/2008 | White | H01L 23/66 |
| | | | | 257/686 |
| 2009/0108462 | A1* | 4/2009 | Peters | H01L 21/76808 |
| | | | | 257/774 |
| 2009/0230562 | A1* | 9/2009 | Kondou | H01L 23/522 |
| | | | | 257/774 |
| 2009/0321871 | A1* | 12/2009 | Weng | H01L 21/76838 |
| | | | | 257/503 |
| 2010/0201440 | A1 | 8/2010 | Nowak | |
| 2010/0246152 | A1* | 9/2010 | Lin | H01L 21/563 |
| | | | | 361/783 |
| 2011/0089574 | A1* | 4/2011 | Itoh | H01L 23/3677 |
| | | | | 257/774 |
| 2011/0108947 | A1* | 5/2011 | Guzek | H05K 1/165 |
| | | | | 257/531 |
| 2011/0156205 | A1* | 6/2011 | Maki | H01L 23/5223 |
| | | | | 257/531 |
| 2011/0248811 | A1 | 10/2011 | Kireev | |
| 2012/0007244 | A1* | 1/2012 | Harrison | H01L 21/02057 |
| | | | | 257/763 |
| 2012/0043630 | A1* | 2/2012 | Omori | H01L 27/228 |
| | | | | 257/421 |
| 2012/0146186 | A1* | 6/2012 | Lukaitis | H01L 23/3677 |
| | | | | 257/536 |
| 2013/0292841 | A1* | 11/2013 | Lai | H01L 23/5226 |
| | | | | 257/774 |
| 2014/0027909 | A1* | 1/2014 | Gstrein | H01L 21/76802 |
| | | | | 257/751 |
| 2014/0035056 | A1* | 2/2014 | Liaw | G11C 11/412 |
| | | | | 257/369 |
| 2016/0093591 | A1* | 3/2016 | Lan | H01L 21/02164 |
| | | | | 257/506 |
| 2019/0043804 | A1* | 2/2019 | Qian | H01L 23/53295 |
| 2019/0206893 | A1* | 7/2019 | Liaw | H01L 21/76895 |
| 2019/0213298 | A1* | 7/2019 | Correale, Jr. | H01L 23/5286 |
| 2019/0279960 | A1* | 9/2019 | Karhade | H01L 23/5226 |
| 2019/0304900 | A1* | 10/2019 | Chen | G06F 30/39 |
| 2020/0058586 | A1* | 2/2020 | Guo | H01L 23/5226 |
| 2020/0058646 | A1* | 2/2020 | Gomes | H01L 27/0688 |

OTHER PUBLICATIONS

Extended European Search Report for EP Patent Appln. No. 14188213.4 (dated Apr. 9, 2015).

* cited by examiner

METALLISATION FOR SEMICONDUCTOR DEVICE

CROSS-REFERENCE TO RELATED APPLICATIONS

This application claims the priority under 35 U.S.C. § 119 of European patent application no. 14188213.4, filed on Oct. 8, 2014, the contents of which are incorporated by reference herein.

The present disclosure relates to a metallisation stack for a semiconductor device, including a method of manufacturing such a metallisation stack. The present disclosure also relates to an electrostatic discharge (ESD) protection device comprising such a metallisation stack, and more particularly a data line or data interface comprising such an ESD protection device.

In certain semiconductor devices inherent parasitic capacitances may be a problem impacting device performance. Such parasitic capacitances may result from a combination of junction capacitance of the semiconductor die, also known as die capacitance, contact pad capacitance and metal stack capacitance. Die capacitance tends to dominate and may result from capacitive effects of p-n junctions within the die. Contact pad capacitance may result from capacitance of bond pads on the die with respect to the die substrate. Metal stack capacitance may result from capacitance between the vertical metal stacks, known as metallisation layers, which connect the bond pads to external connections (also known as pins) on the semiconductor device. In this way the metallisation layers may be seen as plates of a capacitor, with oxide layers there between acting as a dielectric. For example, in ESD protection devices and in particular ESD protection devices used for protection of high data rate interconnects/interfaces such as USB3.1 or HDMI, low capacitance (typically ~250 fF) is required so that the protection device does not interfere with the normal operation of the interconnect/interface. Such ESD protection devices may utilise semiconductor controlled rectifiers (SCR) and in a typical arrangement the SCR may be formed on a ~200 Ωcm p-type substrate. Such a substrate may result in a junction capacitance in the order of ~180 fF and which, taking the ~250 fF example for high data rate interconnects/interfaces given above, results in a ~70 fF limit for the contact pad capacitance and the metal stack capacitance.

SUMMARY

According to embodiments there is provided semiconductor device comprising a metallisation stack. The metallisation stack comprising: a first metallisation layer and a second metallisation layer, wherein the first metallisation layer is electrically connected to the second metallisation layer by a plurality of stacked inter-metal vias. The first metallisation layer may be arranged to connect to a semiconductor die and the second metallisation layer may be arranged to form bond pads and to distribute the current to a device die.

Embodiments may further comprise a contact via arranged to electrically connect the first metallisation layer to an ohmic contact of a semiconductor die.

A vertical thickness of the first metallisation layer may be less than a vertical thickness the second metallisation layer.

The plurality of stacked inter-metal vias may comprise a first inter-metal via and a second inter metal via.

The first inter-metal via and the second inter metal via are directly connected without an intermediate connection. The first inter-metal via may abut a second inter metal via.

Embodiments also relate to a method of manufacturing a semiconductor device having a metallisation stack, the method comprising: forming a first metallisation layer and a second metallisation layer and contacting the first metallisation layer to the second metallisation layer by a plurality of stacked inter-metal vias such that the first metallisation layer is electrically contacted to the second metallisation layer by the plurality of stacked inter-metal vias.

The first metallisation layer may be formed to connect to a semiconductor die and the second metallisation layer forms bond pads and to distribute current to a device die.

A contact via may be arranged to electrically connect the first metallisation layer to a contact of a semiconductor die.

A vertical thickness of the first metallisation layer may be less than a vertical thickness of the second metallisation layer.

The plurality of stacked inter-metal may be formed as first inter-metal via and a second inter metal via. The first inter-metal via and a second inter metal via may be formed to be directly connected without an intermediate connection.

Embodiments relate to electrostatic discharge (ESD) protection devices comprising a semiconductor devices according to embodiments.

Embodiments relate to data transfer lines or data transfer interfaces comprising the ESD protection devices according to embodiments.

DESCRIPTION OF THE DRAWINGS

The invention is described further hereinafter by way of example only with reference to the accompanying drawings in which:

FIG. 1 shows a semiconductor device metallisation stack with intermediate and final metal layers and interconnection vias there between;

FIG. 3 illustrates a semiconductor device metallisation stack with metal layers and interconnection vias there between;

FIGS. 6-1 to 6-6 illustrate the process for manufacturing the semiconductor device of FIG. 3.

In the figures and the following description like reference numerals refer to like features.

FIG. 1 shows a schematic view of a vertical metallisation stack structure for a semiconductor device 100, which may be formed of an alternating vertical arrangement of vias and metallisation layers discussed below. The semiconductor device 100 may comprise a semiconductor device die 110 having a set of sufficiently highly doped diffusions forming ohmic contacts 112. The respective ohmic contacts may connect to respective a cathode and an anode of a semiconductor device, defining a junction width Wnp, for example a cathode and an anode of a ESD protection device.

Figure 1:
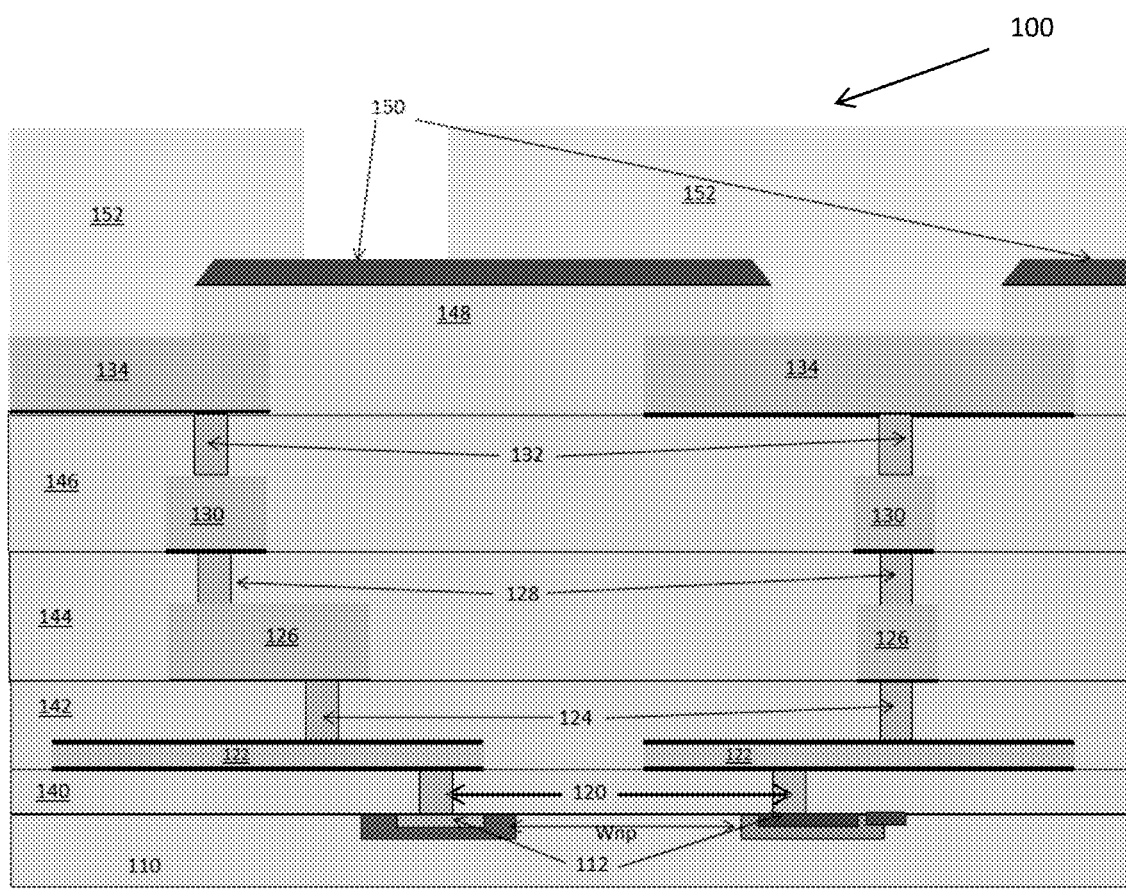

A first set of vias 120, also known as contacts may electrically connect each of the set of ohmic contacts 112 to respective first metallisation layers 122 to contact the first set of vias 120 into the metallisation structure. The first metallisation layers 120 may be separated from the semiconductor device die 110 by an inter-layer dielectric 140.

A second set of vias 124 may electrically connect the respective first metallisation layers 120 to second metallisation layers 126 which function as a routing layer. The first metallisation layers 120 may be separated from the second metallisation layers 126 by an inter-metal dielectric 142.

A third set of vias 128 may electrically connect the respective second metallisation layers 126 to third metallisation layers 130. The second metallisation layers 126 may be separated from the third metallisation layers 130 by an inter-metal dielectric 144.

A fourth set of vias 132 may electrically connect the respective third metallisation layers 130 to fourth metallisation layers 134, known a distribution layer, which functions to carry the current to the device without causing current bottlenecks. The fourth metallisation layers 134 support bond pads of the final device. The third metallisation layers 130 may be separated from the fourth metallisation layers 134 by an inter-metal dielectric 146. Those skilled in the art will understand that the first metallisation layers 120 may be termed "metal 1", the second metallisation layers 126 termed "metal 2", the third metallisation layers 130 "metal 3", and the fourth metallisation layers 134 "metal 4".

A final oxide layer 148 and nitride layer 150 is formed over the vertical metallisation stack structure to protect the semiconductor device 100. Windows may be formed in the final passivation layer 148 and the nitride layer 150 to allow contacting layers 152 to be formed on the fourth metallisation layers 134. Contacting layer 152 may be any appropriate electrically conductive contact material (such as under bump metallisation or Cu/Sn pillars) to allow the semiconductor device to be connected to for example a printed circuit board and/or further external circuitry (not illustrated).

Typically, the vertical thickness of the vias may be between 600 μm and 1000 μm. Typically, the vias may be formed of any appropriate metal such as tungsten W, or aluminium, Al. The vertical thickness of the inter-metal dielectrics and inter-layer dielectric may be between 1340 nm and 3300 nm. Typically the vertical thicknesses of the metal layers may be between 900 nm and 2000 nm. More specifically the vertical thickness of the first metallisation layers 122 may be 900 nm. The first metallisation layers may be formed of titanium nickel, TiN or a titanium aluminium Ti/Al stack. The vertical thickness of the second, third and fourth metallisation layers 126, 130, 134 may be 2000 nm. The second, third and fourth metallisation layers may be formed of titanium nickel, TiN or titanium aluminium Ti/Al stack. The thickness of the second, third and fourth metallisation layers may be larger than the thickness of the first metallisation layers. In this example the thickness of the second, third and fourth metallisation layers may be more than twice the thickness of the first metallisation layers.

Figure 2:
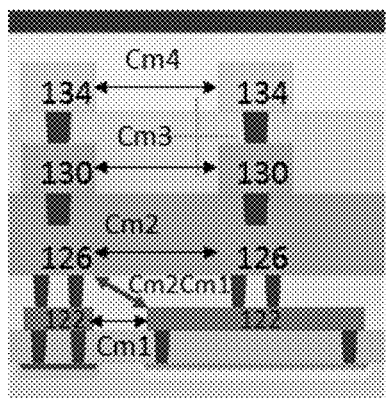
FIG. 2 shows capacitances between metal layers in the metallisation stack of FIG. 1.

FIG. 2 shows intra-layer capacitances of the stack shown in FIG. 1. The capacitance between each metal layer forming first metallisation layers 120 is given by Cm1. The capacitances between each metal layer forming second metallisation layers 126 is given by Cm2. The capacitances between each metal layer forming third metallisation layers 130 is given by Cm3. The capacitances between each metal layer forming fourth metallisation layers 134 is given by Cm4. Each of the capacitances of each metal layer will contribute to the metal stack capacitance and thus the total device capacitance. In addition to the intra-layer capacitances, inter-layer capacitances, such as the capacitance of first metallisation layers 122 and second metallisation layers 126 Cm1m2 may also contribute to the metal stack capacitance. The capacitance of each layer is a function of the thickness of each layer and the distance between the metals in each layer and the skilled person will see that the capacitance Cm4 (or Cm3, Cm2) will be smaller than Cm1.

Figure 3:
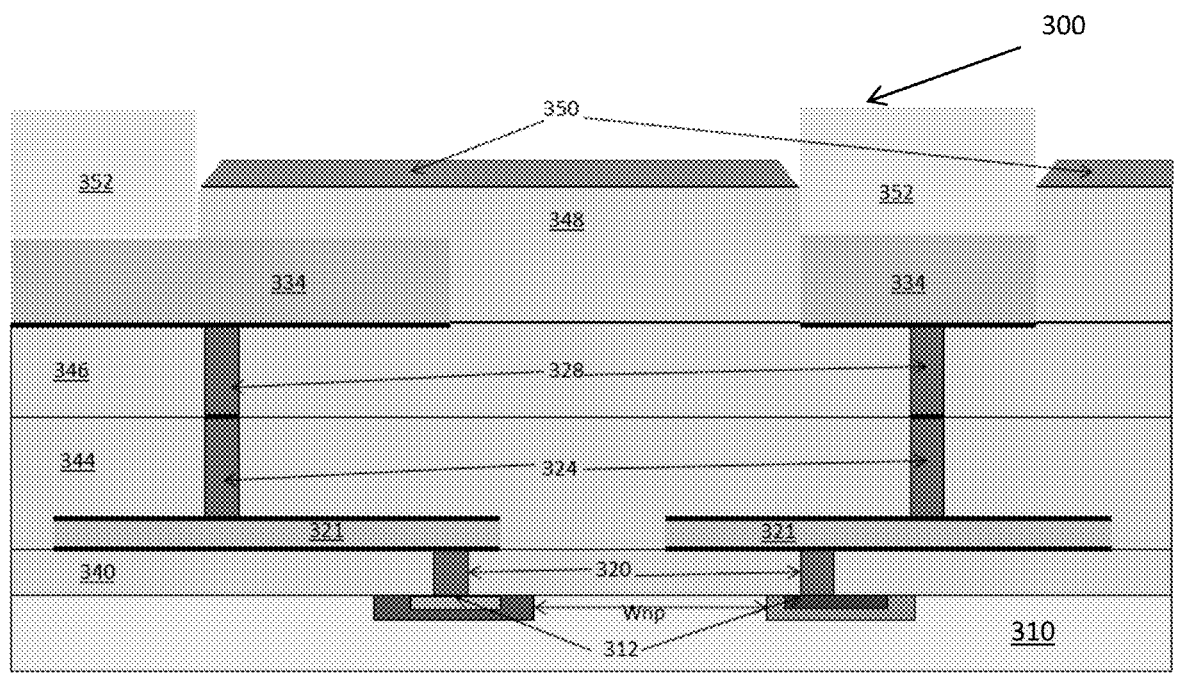

FIG. 3 illustrates a schematic view of a vertical metallisation stack structure for a semiconductor device 300 according to an embodiment. The semiconductor device 300 may comprise a semiconductor device die 310 having a set of ohmic contacts 312.

The respective ohmic contacts may connect to respective a cathode and an anode of a semiconductor device, defining a junction width Wnp, for example a cathode and an anode of a ESD protection device.

A first set of vias 320 also known as contacts may electrically connect to each of the set of ohmic contacts 312 to respective first metallisation layers 321. The first metallisation layers may be thinner than the subsequent metal layer because it may usually be distributed over a larger area. The first metallisation layers 320 may be separated from the semiconductor device die 310 by an inter-layer dielectric 340.

A second set of vias 324 may electrically connect to a third set of vias 328. In this way the second and third set of vias may be considered to be vertically stacked, and electrically and mechanically connected to each other without any intermediate connection. The second set of vias may be connected to respective upper surfaces of the first metallisation layers 320. The third set of vias 328 may be connected to respective lower surfaces of the second metallisation layers 334 Therefore, the first metallisation layers 321 may be directly contacted to the second metallisation layers 334 by the second and third set of vias 324, 328.

The first metallisation layers 321 may be separated from the semiconductor device die 310 by an inter-layer dielectric 340. The first and second metallisation layers may be separated each other by an inter-metal dielectric 344, 346. This dielectric may be a single layer of may comprise a layer arrangement of two or more dielectric layers 344, 346.

A final oxide layer 348 and nitride layer 350 is formed over the vertical metallisation stack structure to protect the semiconductor device 300. Windows may be formed in the passivation layer 348 and the nitride layer 350 to allow contacting layers 352 to be formed on the second (top) metallisation layers 334. Contacting layer 352 may be any appropriate electrically conductive contact material (which may be an appropriate under bump metallisation or Cu/Sn pillars) to allow the semiconductor device to be connected to for example a printed circuit board and/or further external circuitry (not illustrated).

Typically, the vertical thickness of the vias may be between 600 μm and 1000 μm. The vertical thickness of the inter-layer dielectric may be 1340 nm and the vertical thickness of the first set of vias 320 may be 600 nm. The vertical thickness of the first metallisation layers 321 may be 900 nm and the vertical thickness second (top) metallisation layers 334 may be 2000 nm. The passivation layer 348 and the nitride layer 350 may have vertical thicknesses 1200 nm and 900 nm respectively.

Figure 4:
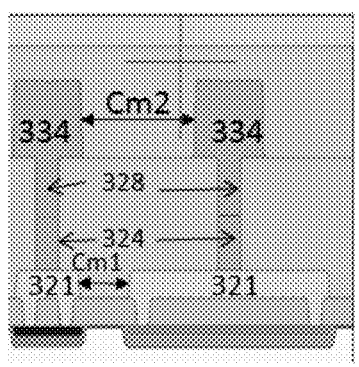
FIG. 4 illustrates capacitances between metal layers in the metallisation stack of FIG. 3.

FIG. 4 illustrates intra-layer capacitances of the stack illustrated in FIG. 3. The capacitance between each metal layer forming first metallisation layers 321 is given by Cm1. The capacitances between each metal layer forming second metallisation layers 334 is given by Cm2. Through the use of vertically stacked second and third vias the separation of the first and second metallisation may be increased. As a result inter layer capacitances, such as the capacitance of first metallisation layers 321 and second metallisation layers 334 may be reduced, when compared with the arrangement of FIGS. 1 and 2, such that it may be considered negligible.

Whilst the above discussion relates to a vertical stacked arrangement of metal layers and vias for connection to each of the corresponding ohmic contacts of a semiconductor device die, the skilled person will also recognise that only one ohmic contact of a semiconductor device may be contacted using this arrangement. Also, the skilled person will appreciate that any specific dimension or range of dimensions provided above are merely given as non-limiting examples.

Figure 5:
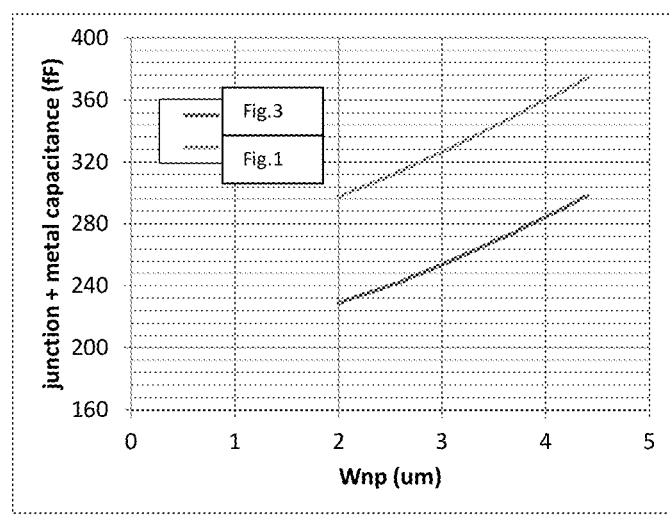
FIG. 5 illustrates a plot of (measured) junction capacitance plus metal capacitance versus lateral distance Wnp between a cathode and anode of a semiconductor device.

FIG. 5 illustrates a comparison of measured junction capacitance plus capacitance of the metallisation stacks (fF) verses junction width Wnp (μm), of the arrangements of FIG. 1 and FIG. 3. As can be observed from FIG. 5, for a specific junction width Wnp, the capacitance of the arrangement of FIG. 3 may be approximately 70 fF lower than the arrangement of FIG. 1. The reduction in capacitance may due removal of capacitive effects of Cm3 and Cm4 and also Cm1m2 shown in FIG. 2. The skilled person will see that this reduction is a marked improvement over the arrangement of FIG. 1. Further reductions in device capacitance may be achieved by reducing bond pad diameters connecting the semiconductor device die to the die substrate.

Figures 1, 6:
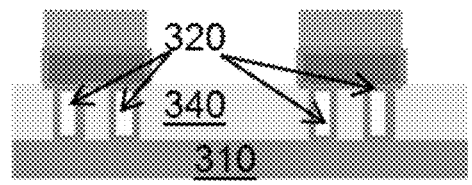
Figures 2, 6:
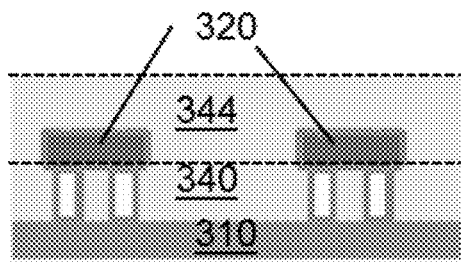
Figures 3, 6:
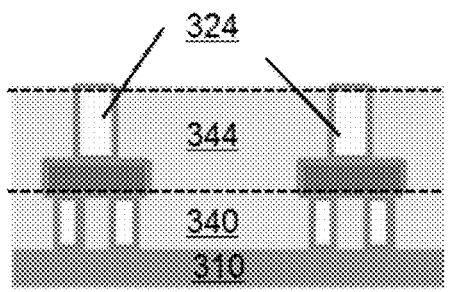
Figures 4, 6:
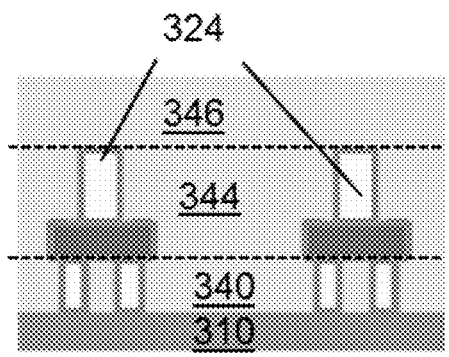
Figures 5, 6:
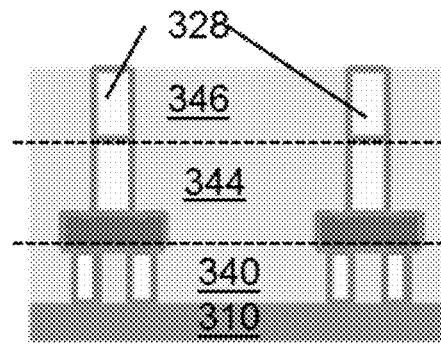
Figure 6:
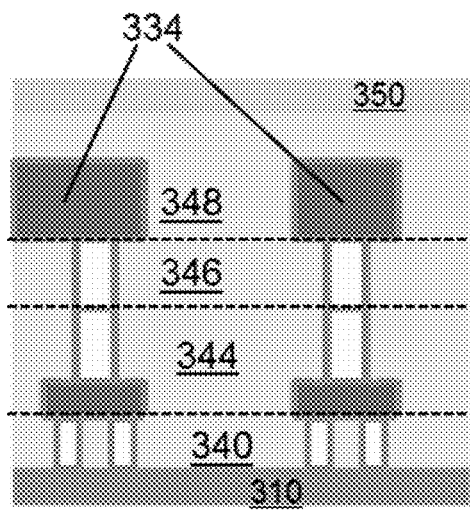

With reference to FIGS. 6-1 to 6-6, a process flow for fabrication of the vertical metallisation stack structure for a semiconductor device 300 will be described. As illustrated in FIG. 6-1, a first oxide layer 340, which may be an inter-layer dielectric 340 such as TEOS may be formed by plasma TEOS or CVD TEOS on a surface of the semiconductor device die 310. The first oxide layer 340 may be selectively etched to form through holes for formation of first set of vias 320 therein, to contact to the bond pads of the semiconductor device die 310. The first set of vias 320 may then be formed in the through holes by for example W deposition such as sputtering.

Following formation of the first set of vias 320, first metallisation layers 321 may be formed by for example sputtering a Ti/Al stack to contact the first set of vias 320 as illustrated in FIG. 6-2. A second oxide layer 344 which may be a first inter-metal dielectric 344 may be formed to cover and enclose the first metallisation layers 321.

As illustrated in FIG. 6-3, the second oxide layer 344 may be selectively etched, by for example by patterned etching such as a plasma etch to form through holes for formation of the second set of vias 324 therein, to contact to the first metallisation layers 321. Referring now to FIG. 6-4, a third oxide layer 346, which may be a second inter-metal dielectric 346 may be formed to cover and enclose the second set of vias 328. As illustrated in FIG. 6-5 the third oxide layer 346 may be selectively etched, as discussed above to form through holes for formation of the third set of vias 328 therein, to contact to the second set of vias 324. FIG. 6-6 illustrates formation by patterned etching, such as plasma etch of the second metallisation layers 334 which may be formed to contact the third set of vias 328. A fourth oxide layer 348, which may be a passivation layer 348, may be formed to cover and enclose the second metallisation layers 334. A final nitride layer 350 may be formed to complete the passivation layer 348.

As illustrated in FIG. 3, the passivation layer 348 including the nitride layer 350 may be etched to allow formation of a contacting layer 352 which may allow the semiconductor device to be connected to for example a printed circuit board and/or further external circuitry (not illustrated).

As mentioned above the first set of vias 320 and the second and third set of vias 324, 328 may be formed of for example Tungsten, W, or aluminum, Al.

The skilled person will therefore see that the metallisation stack may therefore be incorporated into semiconductor device to reduce device capacitance by reducing the capacitance contributions or effects of the metallisation stack.

The metallisation stack may be incorporated in an ESD protection device and the ESD protection device may in turn be incorporated in high data rate interconnections or interfaces such as HDMI2, USB3, MHL. The ESD protection device may be incorporated by connecting a signal line of the ESD protection device to a data line of the specific data connection or interface. A ground connection of the ESD protection device may be connected to the respective ground connection of the specific data connection or interface.

Particular and preferred aspects of the invention are set out in the accompanying independent claims. Combinations of features from the dependent and/or independent claims may be combined as appropriate and not merely as set out in the claims.

The via-on-via arrangement is not limited to only two vias. More vias may be added. There is no maximum number. By adding more vias the spacing of the top metallisation layer (on which bond pads are formed) to the device increases, thus decreasing the capacitance further. So, the arrangement in FIG. 3 may be viewed as only an example of how to stack vias in general.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device comprising:
   a semiconductor device die;
   an inter-layer dielectric layer provided directly on the semiconductor device die; and
   a metallisation stack provided directly on the inter-layer dielectric layer, the metallisation stack comprising a first discrete metallisation layer and a second discrete metallisation layer separated by an inter-metal dielectric layer, wherein the first discrete metallisation layer is electrically connected to the second discrete metallisation layer by a plurality of directly connected stacked inter-metal vias that are vertically stacked between the first discrete metallization layer and the second discrete metallization layer, wherein the first discrete metallisation layer of the metallisation stack is separated from the semiconductor device die by the inter-layer dielectric layer, and wherein the inter-metal dielectric layer does not include a semiconductor layer.

2. The semiconductor device of claim 1, wherein the first discrete metallisation layer is configured to connect to the semiconductor device die and the second discrete metallisation layer is configured to form bond pads and to distribute the current to a device die.

3. The semiconductor device of claim 1, further comprising:
a contact via configured to electrically connect the first discrete metallisation layer to an ohmic contact of a semiconductor die.

4. The semiconductor device of claim 1, wherein a vertical thickness of the first discrete metallisation layer is less than a vertical thickness of the second discrete metallisation layer.

5. The semiconductor device of claim 1, wherein the plurality of stacked inter-metal vias comprises a first inter-metal via and a second inter-metal via, and wherein the first inter-metal via abuts the second inter-metal via.

6. The semiconductor device of claim 1, wherein the inter-metal dielectric layer comprises a first inter-metal dielectric layer directly on the first metallization layer and a second inter-metal dielectric layer directly on the first inter-metal dielectric layer; and
wherein the second metallization layer is directly on the second inter-metal dielectric layer.

7. The semiconductor device of claim 6, wherein the plurality of stacked inter-metal vias comprises a first inter-metal via in the first inter-metal dielectric layer and a second inter-metal via that are directly in the second inter-metal dielectric layer.

8. An electrostatic discharge (ESD) protection device comprising the semiconductor device of claim 1.

9. A data transfer line comprising the ESD protection device of claim 8.

10. The method of manufacturing a semiconductor device having a metallisation stack, the method comprising:
forming a first metallisation layer on an inter-layer dielectric layer that directly contacts the inter-layer dielectric; and
forming the first metallisation layer and a second metallisation layer separated by an inter-metal dielectric layer and contacting the first metallisation layer to the second metallisation layer by a plurality of directly connected stacked inter-metal vias such that the first metallisation layer is electrically connected to the second metallisation layer by the plurality of stacked inter-metal vias, wherein the inter-metal dielectric layer does not include a semiconductor layer;
wherein the plurality of stacked inter-metal vias are vertically stacked between the first metallization layer and the second metallization layer, and
wherein the first metallisation layer of the metallisation stack is separated from the semiconductor device die by the inter-layer dielectric layer.

11. A method of manufacturing the semiconductor device of claim 10, wherein the first metallisation layer is formed to connect to a semiconductor die and the second metallisation layer forms bond pads and to distribute current to a device die.

12. The method of manufacturing the semiconductor device of claim 10, further comprising forming a contact via arranged to electrically connect the first metallisation layer to a contact of a semiconductor die.

13. The method of manufacturing the semiconductor device of claim 10, wherein a vertical thickness of the first metallisation layer is less than a vertical thickness of the second metallisation layer.

14. The method of manufacturing the semiconductor device of claim 10, wherein the plurality of stacked inter-metal are formed as first inter-metal via and a second inter metal via.

15. The method of manufacturing the semiconductor device of claim 14, wherein first inter-metal via and a second inter metal via are formed to be directly connected without an intermediate connection.

* * * * *